United States Patent
Lee et al.

(10) Patent No.: US 6,841,526 B2
(45) Date of Patent: Jan. 11, 2005

(54) CLEANING SOLUTION FOR REMOVING PHOTORESIST

(75) Inventors: Geun Su Lee, Kyoungki-do (KR); Jae Chang Jung, Kyoungki-do (KR); Ki Soo Shin, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/280,834

(22) Filed: Oct. 25, 2002

(65) Prior Publication Data

US 2003/0083215 A1 May 1, 2003

(30) Foreign Application Priority Data

Oct. 25, 2001 (KR) ........................................ 2001-65912

(51) Int. Cl.[7] .............................. C11D 7/32; C11D 7/50
(52) U.S. Cl. ........................ 510/176; 510/175; 510/255; 134/2; 134/42; 430/331
(58) Field of Search ................................. 510/176, 175, 510/499, 202, 245, 212, 255; 134/2, 3, 38, 40, 42; 430/33

(56) References Cited

U.S. PATENT DOCUMENTS

| 5,496,491 A | * | 3/1996 | Ward et al. ................... 510/176 |
| 5,902,780 A | * | 5/1999 | Lee .............................. 510/176 |
| 6,367,486 B1 | * | 4/2002 | Lee et al. ..................... 134/1.3 |

* cited by examiner

Primary Examiner—Gregory Webb
(74) Attorney, Agent, or Firm—Marshall, Gerstein & Borun LLP (57) ABSTRACT

Cleaning solutions for removing photoresist materials and a method of forming underlying layer patterns of semiconductor devices using the same. The cleaning solutions for removing photoresist include a solvent mixture of $H_2O$ and an organic solvent, an amine compound, a transition metal-removing material and an alkali metal-removing material, and may further include a hydrazine hydrate.

17 Claims, 7 Drawing Sheets

Fig.7

CLEANING SOLUTION FOR REMOVING PHOTORESIST

BACKGROUND

1. Technical Field

A cleaning solution is disclosed for removing photoresist materials remaining on underlying layer patterns formed by photolithography process using the photoresist patterns as etching mask.

2. Description of the Related Art

Conventional cleaning solutions for removing photoresist materials remaining on the top portion of an underlying layer are generally organic solvents having amine present in an amount ranging from about 20 to about 40 wt. % of the solution and a mixture of $H_2O_2$, $H_2SO_4$ and $H_2O$.

However, conventional cleaning solutions are environmentally harmful because they include excessive amounts of the amine compounds. The conventional cleaning solutions also have a problem in that they are expensive.

Additionally, in order to remove photoresist materials, a substrate should be soaked in the solution at a temperature greater than 50° C. for about 20 to 30 minutes. This process results in a decrease in productivity.

Further, the mixture of $H_2O_2$, $H_2SO_4$ and $H_2O$ erodes metal, and therefore, an underlying layer pattern is deformed when the underlying layer is metal such as aluminum (Al) or tungsten (W).

In addition, the mixture of $H_2O_2$, $H_2SO_4$ and $H_2O$ is less effective in cleaning photoresists than a solvent having a large quantity of amine. And, when impurities are removed, a process needs to be performed at a high temperature of 50 to 120° C. Therefore, special procedures are required.

Figure 6:
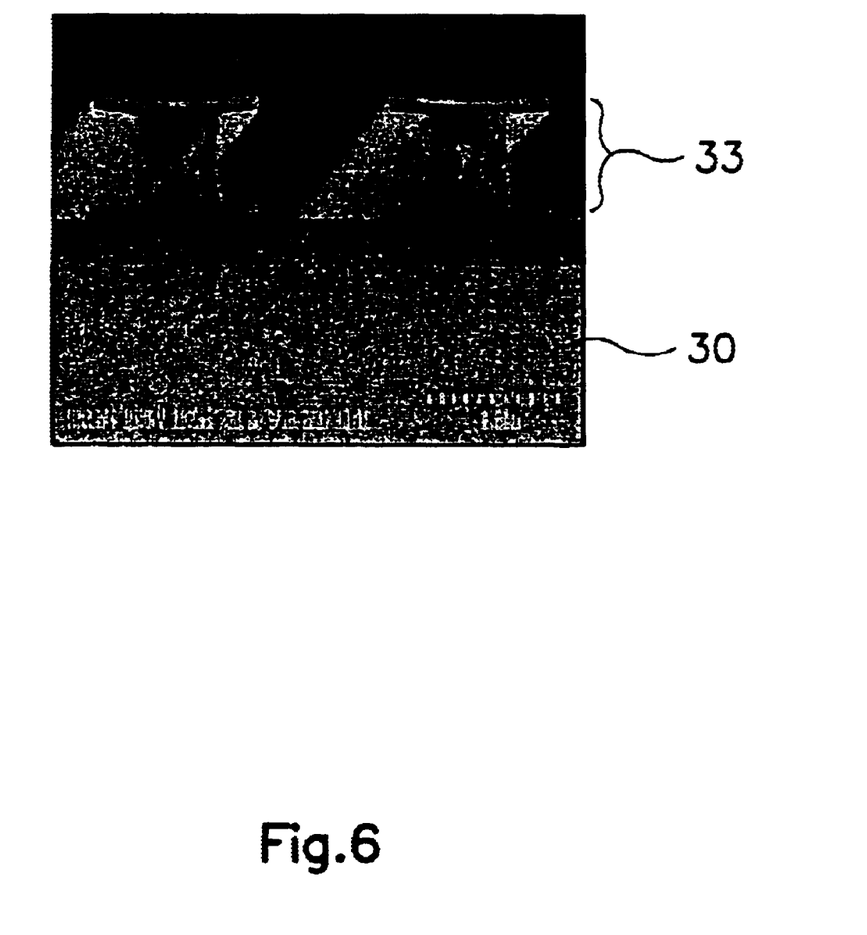
FIG. 6 is a SEM photograph of a resultant pattern after cleaning remaining photoresist on the aluminum pattern using a conventional cleaning solution.

FIG. 6 is a SEM photograph of a formed aluminum pattern (33) after cleaning the remaining photoresist on the aluminum pattern using a conventional cleaning solution of $H_2O_2$, $H_2SO_4$ and $H_2O$. As shown in FIG. 6, the lateral surface of the aluminum pattern is severely damaged when the photoresist remaining on the aluminum pattern is cleaned with the conventional mixture.

Figure 7:
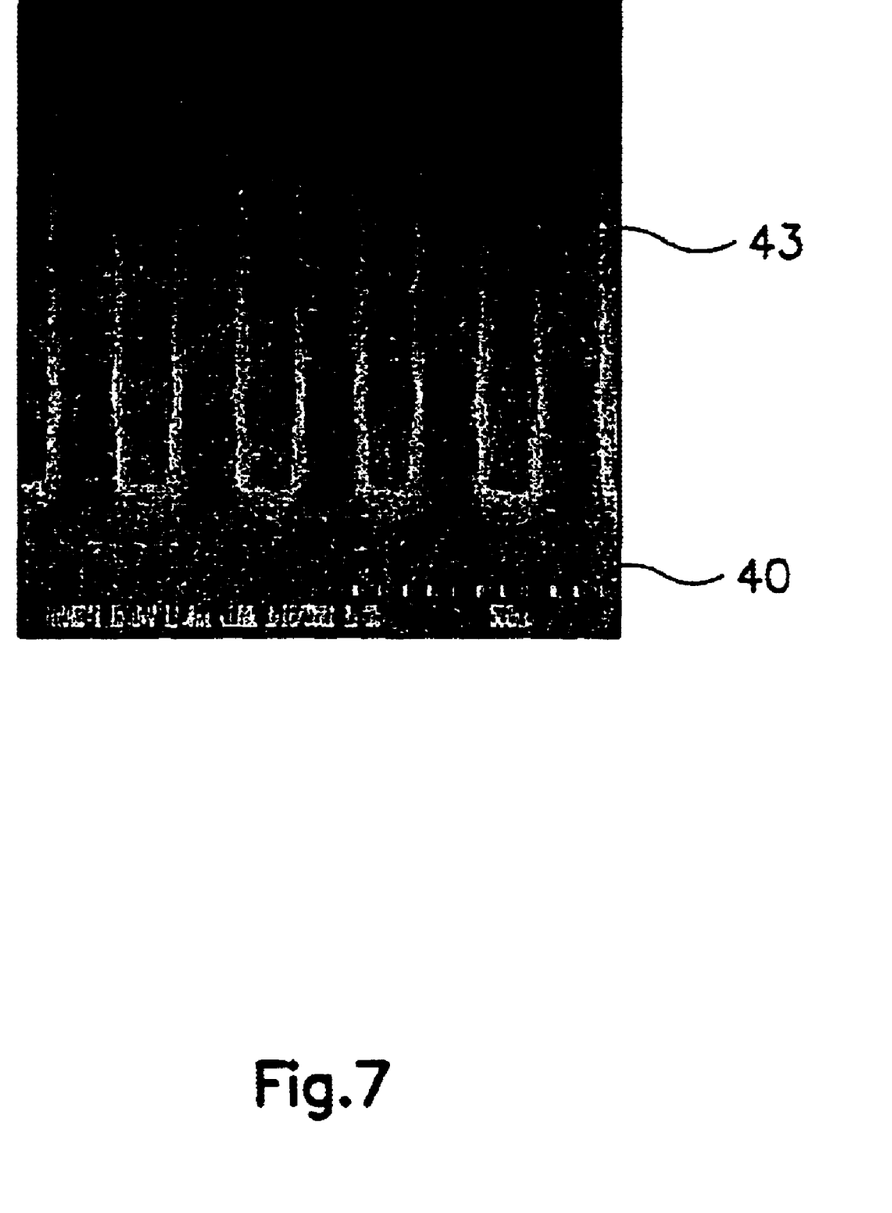
FIG. 7 is a SEM photograph of a resultant pattern after cleaning remaining photoresist on the tungsten pattern using a conventional cleaning solution.

FIG. 7 is a SEM photograph of a formed tungsten pattern (43) after cleaning the remaining photoresist on the tungsten pattern using a conventional cleaning solution of $H_2O_2$, $H_2SO_4$ and $H_2O$. As shown in FIG. 7, the lateral surface of the tungsten pattern is also severely damaged when the photoresist remaining on the tungsten pattern is cleaned with the conventional mixture.

SUMMARY OF THE DISCLOSURE

A cleaning solution for removing photoresist materials is disclosed which comprises a mixture solvent of $H_2O$ and an organic solvent, an amine compound, a transition metal-removing material and an alkali metal-removing material, and which may further optionally comprise a hydrazine hydrate.

A method for forming an underlying layer pattern of a semiconductor device is disclosed which uses the disclosed cleaning solution for removing photoresist materials.

DETAILED DESCRIPTION OF THE PRESENTLY PREFERRED EMBODIMENTS

A cleaning solution for removing photoresist materials is disclosed which comprises a mixture solvent of $H_2O$ and an organic solvent, an amine compound, a transition metal-removing material and an alkali metal-removing material.

The amine compound is present in an amount ranging from about 0.5 to about 30 parts by weight, preferably from about 0.51 to 20 parts by weight to 100 parts by weight of the mixture solvent.

The amine compound dissolves the photoresist materials. When the amount of the amine compound is less than 0.5 part by weight, it is difficult to remove photoresist, while when it is more than 30 parts by weight, it has a high cost.

The cleaning solution for removing photoresist materials can rapidly and effectively remove photoresist, and it includes a smaller amount of amine compound than the conventional cleaning solution because the cleaning solution also comprises the transition metal-removing material and the alkali metal-removing material.

In addition, the cleaning solution for removing photoresist materials is an environment-friendly cleaning solution and has a low cost.

It is preferable that the amine compound is selected from the group consisting of $NH_2(CH_2)_nOH$ (wherein n is an integer from 0 to 10), $N(C_mH_{2m+1})_3$ (wherein m is an integer from 1 to 10), $N(C_lH_{2l+1}OH)_3$ (wherein l is an integer from 1 to 10), $NH_4OH$, $NH_4F$, $NH_4Cl$ and mixtures thereof.

The $H_2O$ of mixture solvent is preferably distilled water.

The organic solvent is not specifically limited, but includes the examples thereof, dimethyl sulfoxide (abbreviated as "DMSO"), dimethyl formamide (abbreviated as "DMF"), methyl 3-methoxy propionate (abbreviated as "MMP"), propylene glycol methyl ether acetate (abbreviated as "PGMEA"), propylene glycol ethyl ether acetate (abbreviated as "PGEEA") and mixtures thereof.

In the disclosed cleaning solution, the ratio of $H_2O$: organic solvent is in the range of 5~95:95~5 wt. %, preferably 30~70:70~30 wt. %, and the combination of $H_2O$ and an organic solvent is present in an amount of over 70 wt. %, desirably, ranging from about 70 to about 99 wt. % of the cleaning solution.

The transition metal-removing material removes particles of transition metal existing on the underlying layer surface or in the photoresist. It is preferable that the transition metal-removing material is selected from the group consisting of ethylenediamine tetraacetic acid (EDTA), 2,2'-dipyridyl, 2,2'-dipyridylamine, 1,4,8,12-tetraazacyclopentadecane, 1,4,8,11- tetraazacyclotetradecane, 1,4,8,11-tetraazacyclotetradecane-5,7-dione, 1,4,8,11-tetraazacyclotetradecane-1,4,8,11-tetraacetic acid and mixtures thereof.

The transition metal-removing material is present in an amount ranging from about 0.001 to about 5 parts by weight to 100 parts by weight of the mixture solvent.

The alkali metal-removing material removes particles of alkali metal existing on the underlying layer surface or in the photoresist. It is preferable that the alkali metal-removing material is selected from the group consisting of 15-crown-5, 18-crown-6, 1-aza-12-crown-4, 1-aza-15-crown-5, 1-aza-18-crown-6, polyethylene oxide, ethylene glycol, diethylene glycol, triethylene glycol, tetraethylene glycol, catechol and mixtures thereof.

The alkali metal-removing material is present in an amount ranging from about 0.001 to about 5 parts by weight to 100 parts by weight of the mixture solvent.

A cleaning solution comprises from about 0.5 to about 30 parts by weight of the amine compound, from about 0.001 to about 5 parts by weight of the transition metal-removing material and from about 0.001 to about 5 parts by weight of the alkali metal-removing material, more preferably from about 0.51 to about 20 parts by weight of the amine compound, from about 0.001 to about 5 parts by weight of the transition metal-removing material and from about 0.001 to about 5 parts by weight of the alkali metal-removing material per 100 parts by weight to 100 parts the mixture solvent.

In addition, the cleaning solution may further comprise the hydrazine hydrate.

The hydrazine hydrate ($NH_2NH_2 \cdot XH_2O$) prevents oxidation of metal when the underlying layer is formed of metal such as aluminum and tungsten. It is preferable that the hydrazine hydrate is present in an amount ranging from about 0.01 to about 20 parts by weight per 100 parts of the mixture solvent.

However, when the underlying layer is formed of non-metal, the cleaning solution need not comprises the hydrazine hydrate.

A cleaning solution with hydrazine hydrate comprises from about 0.5 to about 30 parts by weight of the amine compound, from about 0.1 to about 20 parts by weight of the hydrazine hydrate, from about 0.001 to about 5 parts by weight of the transition metal-removing material and from about 0.001 to about 5 parts by weight of the alkali metal-removing material, more preferably from about 0.51 to about 20 parts by weight of the amine compound, from about 0.1 to about 20 parts by weight of the hydrazine hydrate, from about 0.001 to about 5 parts by weight of the transition metal-removing material and from about 0.001 to about 5 parts by weight of the alkali metal-removing material to 100 parts by weight of the mixture solvent.

There is also provided a method of forming an underlying layer pattern of a semiconductor device, comprising:
  forming an underlying layer on wafer;
  forming a photoresist pattern on a top portion of the underlying layer using a photolithography process;
  forming an underlying layer pattern by etching the underlying layer using the photoresist pattern as etching mask; and
  cleaning the resultant using the disclosed cleaning solutions to remove photoresist materials remaining on the underlying layer pattern.

Here, the underlying layer may be a metal layer, an insulating layer or a conductive layer.

The disclosed cleaning solutions for removing photoresist materials will now be described in more details referring to examples below, which are not intended to be limiting.

EXAMPLE 1

Preparation of Cleaning Solution

Distilled water (1L), DMSO (1L), NH4F (1 g), triethanolamine (10 mL), $NH_2NH_2 \cdot H_2O$ (10 g), EDTA (0.1 g), 18-crown-6 (1,4,7,10,13,16-hexaoxacyclooctadecane) (0.01 g) and polyethylene oxide having weight average molecular weight of 100,000 (0.1 g) were stirred at room temperature for 10 minutes. The resulting mixture was filtered through 0.2 $\mu$m filter to obtain cleaning solution for removing photoresist material.

EXAMPLE 2

Removal of Photoresist Material Using the Cleaning Solution

After a wafer coated with i-line photoresist IX 061 produced by Japan Synthetic Rubber (JSR) at a thickness of 5000 Å was set up in the cleaning solution prepared in Example 1, ⅓ of the wafer and the photoresist material was soaked in the cleaning solution. Then, thickness of the soaked and unsoaked portions was compared. As a result, the soaked portion had the thickness of 0 Å, that is, photoresist material was completely removed.

EXAMPLE 3

Removal of Photoresist Material Remaining on Aluminum Pattern Using the Cleaning Solution After an aluminum layer was formed on the wafer (10) according to a conventional semiconductor process, photoresist was coated on the top portion of the aluminum layer. Then, a photoresist pattern was formed using a photolithography process.

Figure 1:
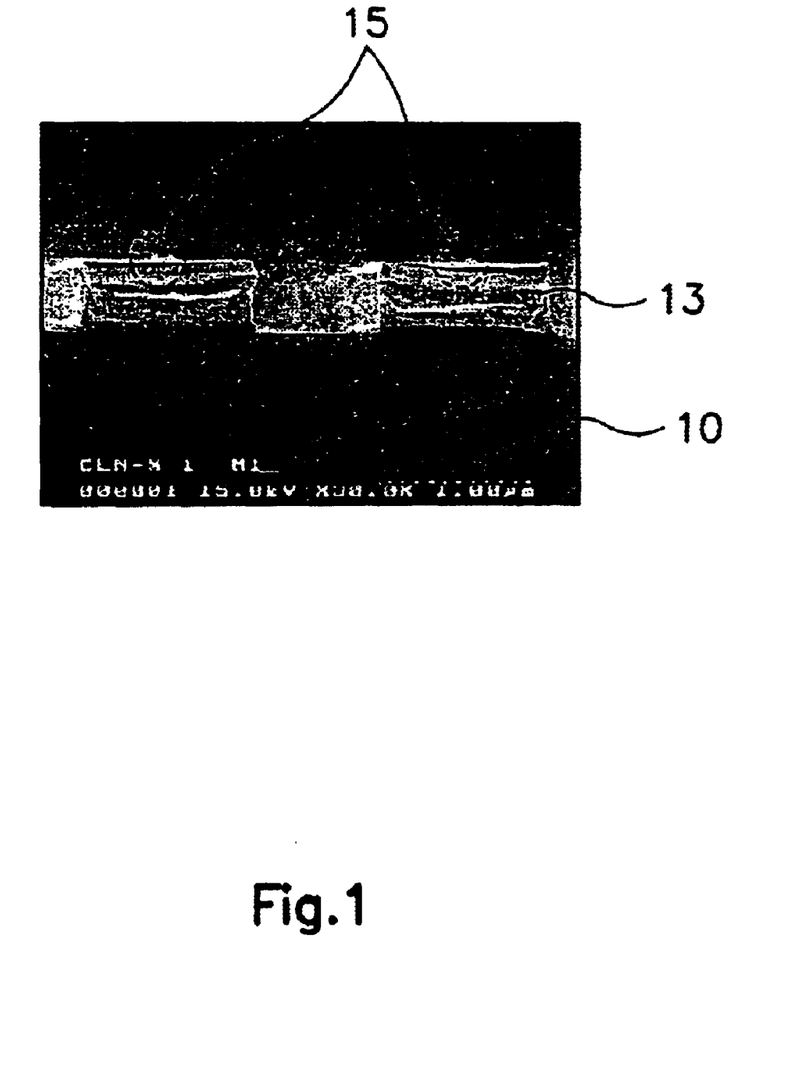
FIG. 1 is a SEM photograph of an aluminum pattern.

Thereafter, an aluminum pattern (13) was obtained by etching the aluminum layer using the photoresist pattern as etching mask, and a photoresist pattern was removed. Here it was shown that photoresist (15) remained on the top portion of the aluminum pattern (13) (see FIG. 1).

Figure 2:
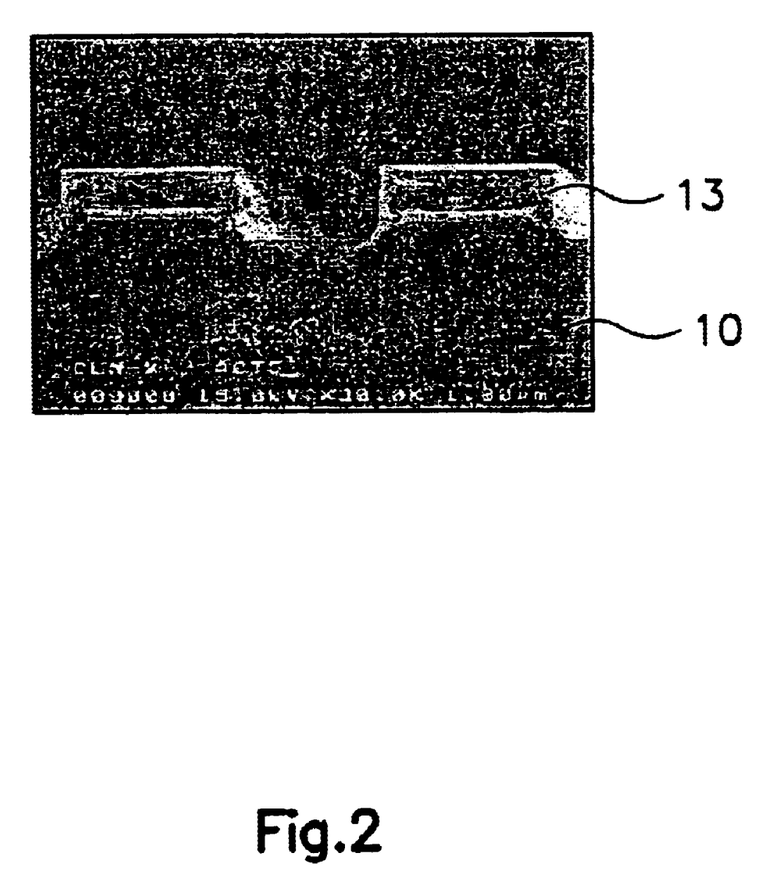
FIG. 2 is a SEM photograph of a lateral face of resultant pattern after cleaning remaining photoresist of FIG. 1 using a disclosed cleaning solution.
Figure 3:
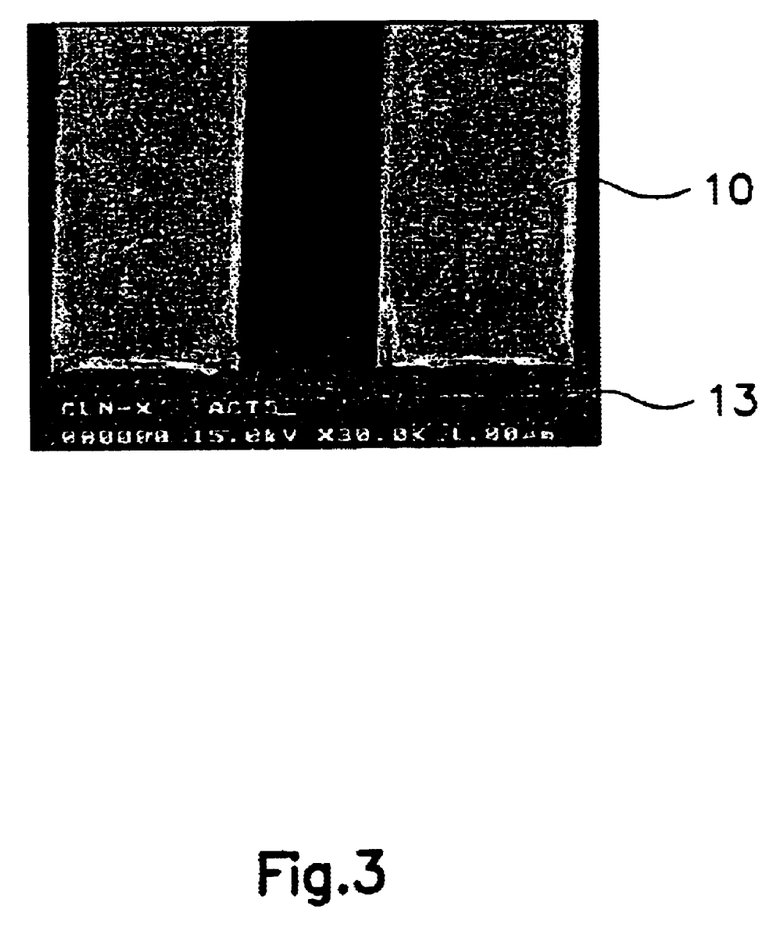
FIG. 3 is a SEM photograph of the top portion of resultant pattern after cleaning remaining photoresist of FIG. 1 using a disclosed cleaning solution.

The above resultant was soaked in the cleaning solution prepared in Example 1 at room temperature for 5 minutes. Then, the resultant was cleaned with distilled water. Here, it was shown that the remaining photoresist (15) was removed and the aluminum pattern (13) was scarcely damaged by the cleaning solution (See FIGS. 2 and 3).

EXAMPLE 4

Removal of Photoresist Material Remaining on Tungsten Bit Line Pattern Using the Cleaning Solution After a tungsten layer was formed on the wafer (20) according to a conventional semiconductor process, photoresist was coated on the top portion of the tungsten layer. Then, a tungsten bit line pattern was formed using a photolithography process.

Figure 4:
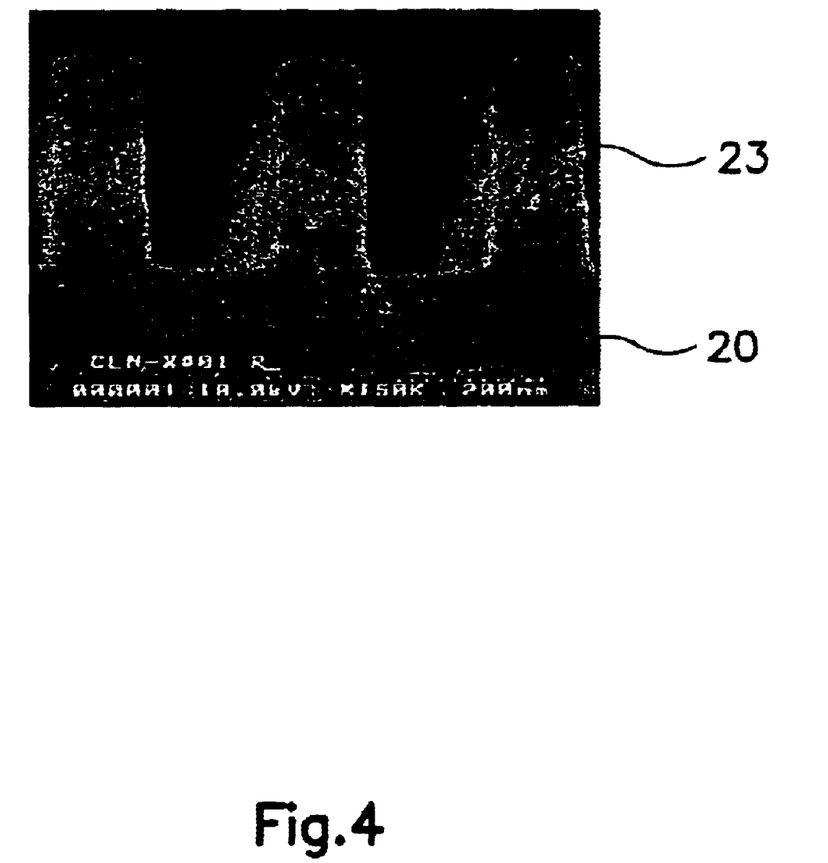
FIG. 4 is a SEM photograph of a tungsten bit line pattern.

Thereafter, a tungsten bit line pattern (23) was obtained by etching the tungsten layer using the photoresist pattern as etching mask, and a photoresist pattern was removed (see FIG. 4).

The above structure was soaked in the cleaning solution prepared in Example 3 at room temperature for 5 minutes. Then, the resultant was cleaned with distilled water.

Figure 5:
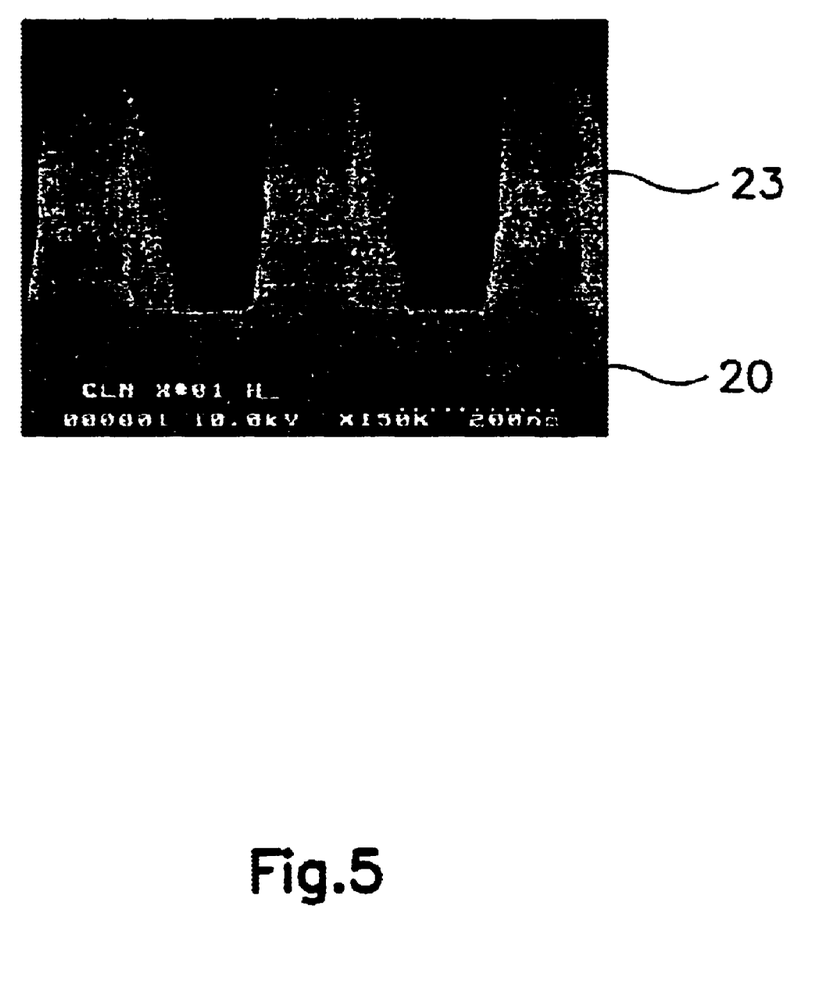
FIG. 5 is a SEM photograph of a resultant pattern after cleaning remaining photoresist materials of FIG. 4 using disclosed cleaning solution.

Here, it is shown that the remaining photoresist was removed and the tungsten bit line pattern (23) was scarvely damaged by the cleaning solution (see FIG. 5)

COMPARATIVE EXAMPLE 1

Conventional Method of Removing Photoresist Material Remaining on Aluminum Pattern After aluminum pattern was formed on the wafer (30) according to Example 7 and a photoresist pattern was removed. Here, it was shown that photoresist remained on the aluminum pattern.

The above resultant was soaked in a conventional cleaning solution including mixture solution of $H_2SO_4$, $H_2O_2$, and $H_2O$ (1:1:1 wt %) at room temperature for 5 minutes, the resultant was cleaned with distilled water. Then, thickness of the soaked and unsoaked portions was compared.

As a result, the soaked portion of underlying pattern (33) was severely damaged (see FIG. 6).

COMPARATIVE EXAMPLE 2

A Conventional Method of Removing Photoresist Material Remaining on Aluminum Pattern After aluminum pattern was formed on the wafer according to Example 7 and a photoresist pattern was removed. Here, it was shown that photoresist remained on the aluminum pattern.

The above resultant was soaked in a conventional cleaning solution including mixture solution of HF, $H_2O_2$ and $H_2O$ (1:1:1 wt %) at room temperature for 5 minutes, the resultant was cleaned with distilled water. Then, thickness of the soaked and unsoaked portions was compared.

As a result, the soaked portion of underlying layer pattern was severely damaged.

COMPARATIVE EXAMPLE 3

A Conventional Method of Removing Photoresist Material Remaining on Tungsten Pattern After tungsten bit line pattern was formed on the wafer (40) according to Example 8 and a photoresist pattern was removed. Here, it was shown that photoresist remained on the tungsten pattern.

The above resultant was soaked in a conventional cleaning solution including mixture solution of $H_2SO_4$, $H_2O_2$ and $H_2O$ (1:1:1 wt %) at room temperature for 5 minutes, the resultant was cleaned with distilled water. Then, thickness of the soaked and unsoaked portions was compared.

As a result, the soaked portion of underlying layer pattern (43) was severely damaged (see FIG. 7).

As discussed earlier, cleaning solutions for removing photoresist according to this disclosure can rapidly and effectively remove photoresist, are environment-friendly and are low cost because they include smaller amounts of amine compounds than conventional cleaning solutions.

Additionally, the disclosed cleaning solutions for removing photoresist have little on effect metal layers thereby contributing to effective mass production of such devices with metal layers.

What is claimed is:

1. A cleaning solution for removing photoresist material comprising:

a solvent mixture comprising $H_2O$ and an organic solvent;

an amine compound;
a transition metal-removing material;
an alkali metal-removing material;
a hydrazine hydrate.

2. The cleaning solution according to claim 1, wherein the amine compound is present in an amount ranging from about 0.5 to about 30 parts by weight per 100 parts by weight of the solvent.

3. The cleaning solution according to claim 1, wherein the amine compound is present in an amount ranging from about 0.51 to about 20 parts by weight per 100 weight parts of the solvent.

4. The cleaning solution according to claim 1, wherein the amine compound is selected from the group consisting of $NH_2(CH_2)_nOH$ (wherein n is an integer from 0 to 10), $N(C_mH_{2m+1})_3$ (wherein m is an integer from 1 to 10), $N(C_lH_{2l+1}OH)_3$ (wherein l is an integer from 1 to 10), $NH_4OH$, $NH_4F$, $NH_4Cl$ and mixtures thereof.

5. The cleaning solution according to claim 1, wherein the organic solvent is selected from the group consisting of dimethyl sulfoxide (DMSO), dimethyl formamide (DMF), methyl 3-methoxy propionate (MMP), propylene glycol methyl ether acetate, propylene glycol ethyl ether acetate and mixtures thereof.

6. The cleaning solution according to claim 1, wherein the ratio of $H_2O$ to the organic solvent ranges from about 5:95 to about 95:5 wt. %.

7. The cleaning solution according to claim 1, wherein the ratio of $H_2O$ to organic solvent is ranges from about 30:70 to about 70:30 wt. %.

8. The cleaning solution according to claim 1, wherein the transition metal-removing material is selected from the group consisting of ethylenediamine tetraacetic acid (EDTA), 2,2'-dipyridyl, 2,2'-dipyridylamine, 1,4,8,12-tetraazacyclopentadecane, 1,4,8,11-tetraazacyclotetradecane, 1,4,8,11-tetraazacyclotetradecane-5,7-dione, 1,4,8,11-tetraazacyclotetradecane-1,4,8,11-tetraacetic acid and mixtures thereof.

9. The cleaning solution according to claim 1, wherein the transition metal-removing material is present in an amount ranging from about 0.001 to about 5 parts by weight per 100 parts by weight of the mixture solvent.

10. The cleaning solution according to claim 1, wherein the alkali metal-removing material is selected from the group consisting of 15-crown-5,18-crown-6,1-aza-12-crown-4,1-aza-15-crown-5,1-aza-18-crown-6, polyethylene oxide, ethylene glycol, diethylene glycol, triethylene glycol, tetraethylene glycol, catechol and mixtures thereof.

11. The cleaning solution according to claim 1, wherein the alkali metal-removing material is present in an amount ranging from about 0.001 to about 5 parts by weight per 100 parts by weight of the solvent mixture.

12. The cleaning solution according to claim 1, wherein the solution comprises from about 0.5 to about 30 parts by weight of an amine compound, from about 0.001 to about 5 parts by weight of a transition metal-removing material and from about 0.001 to about 5 parts by weight of an alkali metal-removing material per 100 weight parts of the solvent mixture.

13. The cleaning solution according to claim 1, wherein the solution comprises from about 0.51 to about 20 parts by weight of an amine compound, from about 0.001 to about 5 parts by weight of a transition metal-removing material and from about 0.001 to about 5 parts by weight of an alkali metal-removing material per 100 weight parts of the mixture solvent.

14. The cleaning solution according to 1, wherein the hydrazine hydrate is present in an amount ranging from about 0.1 to about 20 parts by weight per 100 weight parts of the mixture solvent.

15. The cleaning solution according to claim 1, wherein the solution comprises from about 0.5 to about 30 parts by weight of an amine compound, from about 0.1 to about 20 parts by weight of a hydrazine hydrate, from about 0.001 to about 5 parts by weight of a transition metal-removing material and from about 0.001 to about 5 parts by weight of an alkali metal-removing material per 100 weight parts of the mixture solvent.

16. The cleaning solution according to claim 1, wherein the solution comprises from about 0.51 to about 20 parts by weight of an amine compound, from about 0.1 to about 20 parts by weight of a hydrazine hydrate, from about 0.001 to about 5 parts by weight of a transition metal-removing material and from about 0.001 to about 5 parts by weight of an alkali metal-removing material per 100 weight parts of the mixture solvent.

17. The cleaning solution according to claim 1, wherein the solution comprises $H_2O$/DMSO solvent mixture, $NH_4F$ and triethanolamine as the amine compounds, hydrazine hydrate, EDTA as the transition metal-removing material, and 18-crown-6 and polyethylene oxide as the alkali metal-removing material.

\* \* \* \* \*

UNITED STATES PATENT AND TRADEMARK OFFICE
CERTIFICATE OF CORRECTION

PATENT NO. : 6,841,526 B2
DATED : January 11, 2005
INVENTOR(S) : Geun Su Lee et al.

It is certified that error appears in the above-identified patent and that said Letters Patent is hereby corrected as shown below:

Title page,
Item [75], Inventor, after "Ki Soo Shin" please delete "Seoul (KR)" and insert
-- Kyoungki-do (KR) -- in its place.
Item [73], Assignee, please delete "Kyoungki-Do (KR)" and insert -- Kyoungki-do (KR) -- in its place.

Column 6,
Line 3, after "an alkali metal-removing" please delete "material;" and insert
-- material; and -- in its place.

Signed and Sealed this

Fifth Day of July, 2005

JON W. DUDAS
*Director of the United States Patent and Trademark Office*